United States Patent
Ganesan et al.

(10) Patent No.: US 9,640,887 B2
(45) Date of Patent: May 2, 2017

(54) LOW PROFILE ZERO/LOW INSERTION FORCE PACKAGE TOP SIDE FLEX CABLE CONNECTOR ARCHITECTURE

(71) Applicant: Intel Corporation, Santa Clara, CA (US)

(72) Inventors: Sanka Ganesan, Chandler, AZ (US); Ram S. Viswanath, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/135,413

(22) Filed: Apr. 21, 2016

(65) Prior Publication Data

US 2016/0240949 A1 Aug. 18, 2016

Related U.S. Application Data

(62) Division of application No. 13/996,498, filed as application No. PCT/US2011/066288 on Dec. 20, 2011, now Pat. No. 9,324,678.

(51) Int. Cl.
*H02G 3/04* (2006.01)
*H01R 12/79* (2011.01)
(Continued)

(52) U.S. Cl.
CPC ............... *H01R 12/79* (2013.01); *H01B 7/04* (2013.01); *H01L 23/3675* (2013.01); *H01L 23/49811* (2013.01); *H01L 23/49838* (2013.01); *H01L 24/17* (2013.01); *H01L 24/72* (2013.01); *H01R 12/62* (2013.01); *H05K 1/142* (2013.01); *H05K 3/361* (2013.01); *H01L 2224/16* (2013.01); *H01L 2224/16225* (2013.01); *H01L 2224/16227* (2013.01); *H01L 2924/00014* (2013.01); *H01L 2924/14* (2013.01); *H01L 2924/15192* (2013.01); *H01L 2924/15311* (2013.01); *H05K 1/147* (2013.01); *H05K 2201/10318* (2013.01); *H05K 2201/10325* (2013.01);
(Continued)

(58) Field of Classification Search
CPC . H05K 2201/10325; H05K 2201/1053; H01B 7/04
USPC ...................................... 174/68.1, 74 R, 261
See application file for complete search history.

(56) References Cited

U.S. PATENT DOCUMENTS 9,265,170 B2 * 2/2016 Swaminathan ...... H01R 12/716
2001/0036756 A1 11/2001 Miyazawa et al.
(Continued)

OTHER PUBLICATIONS

International Search Report mailed Aug. 14, 2012 for PCT/US2011/066288, filed Dec. 20, 2011, 3 pages.

*Primary Examiner* — S. V. Clark
(74) *Attorney, Agent, or Firm* — Blakely, Sokoloff, Taylor & Zafman LLP

(57) ABSTRACT

An integrated circuit package is presented. In an embodiment, the integrated circuit package has contact pads formed on the top side of a package substrate, a die electrically attached to the contact pads, and input/output (I/O) pads formed on the top side of the package substrate. The I/O pads are electrically connected to the contact pads. The integrated circuit package also includes a flex cable receptacle electrically connected to the I/O pads on the top side of the package substrate. The flex cable receptacle is non-compressively attachable to a flex cable connector and includes receptacle connection pins electrically connected to the I/O pads.

6 Claims, 6 Drawing Sheets

(51) Int. Cl.
*H01R 12/62* (2011.01)
*H05K 1/14* (2006.01)
*H05K 3/36* (2006.01)
*H01L 23/498* (2006.01)
*H01B 7/04* (2006.01)
*H01L 23/00* (2006.01)
*H01L 23/367* (2006.01)

(52) U.S. Cl.
CPC .............. *H05K 2201/10424* (2013.01); *H05K 2201/10674* (2013.01); *H05K 2201/10681* (2013.01); *H05K 2201/2009* (2013.01)

(56) References Cited

U.S. PATENT DOCUMENTS

| | | | |
|---|---|---|---|
| 2003/0222282 | A1 | 12/2003 | Fjelstad et al. |
| 2008/0131997 | A1 | 6/2008 | Kim et al. |
| 2008/0309349 | A1* | 12/2008 | Sutono ............. G01R 31/31901 324/537 |
| 2010/0078781 | A1 | 4/2010 | Ganesan et al. |
| 2015/0222068 | A1* | 8/2015 | Braun .................... H05K 3/363 29/868 |
| 2016/0181714 | A1* | 6/2016 | Chawla ................ H05K 7/1069 361/679.31 |

* cited by examiner

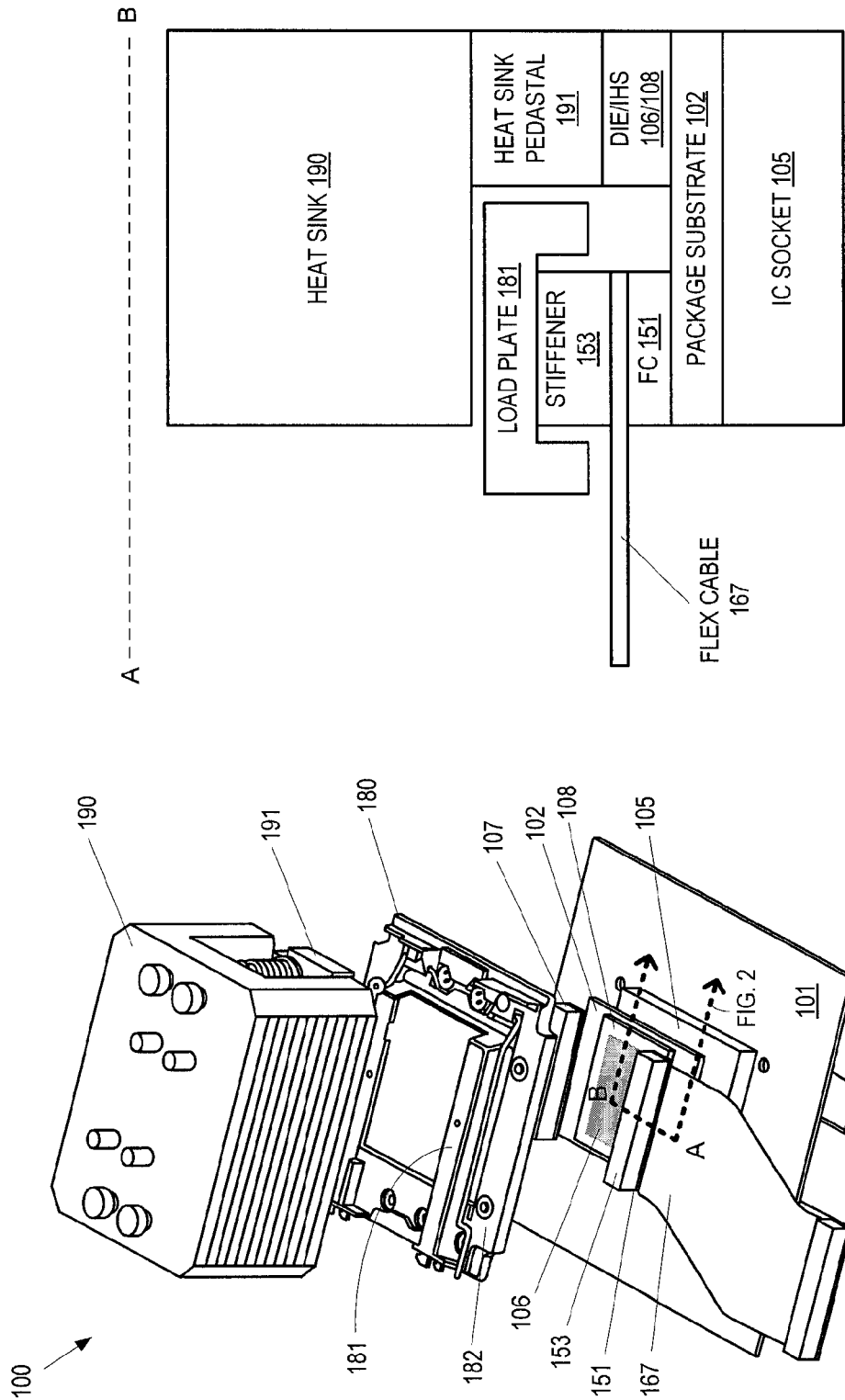

LOW PROFILE ZERO/LOW INSERTION FORCE PACKAGE TOP SIDE FLEX CABLE CONNECTOR ARCHITECTURE

This is a Divisional of application Ser. No. 13/996,498 filed Jun. 20, 2013 which is a U.S. National Phase Application under 35 U.S.C. §371 of International Application No. PCT/US2011/066288 filed Dec. 20, 2011.

FIELD OF THE INVENTION

This invention relates generally to an integrated circuit package. More specifically, this invention relates to an integrated circuit package for connecting to a high speed input/output (I/O) flex cable.

BACKGROUNDS AND RELATED ARTS

One way of interconnecting signals from one integrated circuit device to another integrated circuit device is to route the signals through the package substrate of one device down to a device socket, onto a motherboard such as a printed circuit board (PCB), and through another device socket up the package substrate of the other device. However, signals along this path are susceptible to signal degradation and losses due to parasitics, transmission and return losses, and cross talks. The signal degradation and losses along this path are especially pronounced for high speed signals. For high speed signals, an interconnect path through two sockets and a PCB may degrade the signal enough to cause difficulty in recovering the signal correctly at the destination due to the transmission losses. For example, for a 10 GigaHertz (GHz) signal, an interconnect path along a 20 inch channel of a multilayer PCB may have a transmission loss of about 25 decibels (dB). Transmission losses may be reduced, for example, by constructing the PCB with better composite materials that have better dielectric characteristics. However, even with better composite materials, significant transmission losses may still be occur for longer interconnect paths and at higher signaling rates.

BRIEF DESCRIPTION OF THE DRAWINGS

FIG. 1 illustrates a stack up of an exemplary integrated circuit package assembly according to one embodiment of the present invention.

FIG. 2 illustrates a cross section view of an exemplary integrated circuit package assembly according to one embodiment of the present invention.

DETAILED DESCRIPTION OF THE PREFERRED EMBODIMENTS

Figure 3:
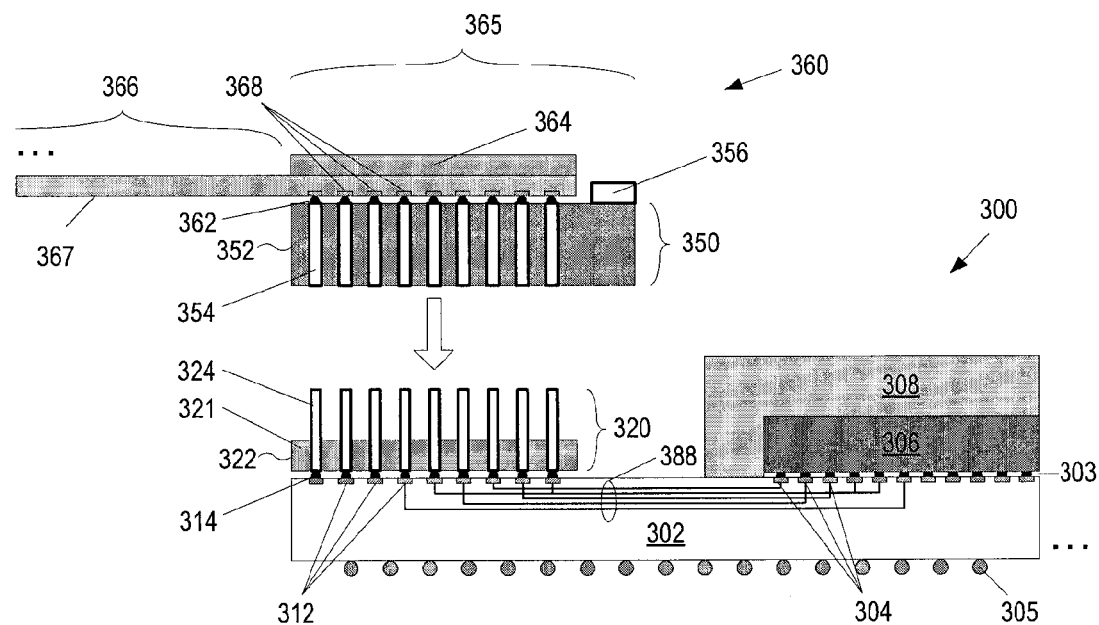
FIG. 3 illustrates a cross sectional view of an integrated circuit package and a flex cable assembly according to another embodiment of the present invention.

The following description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in a simple block diagram format in order to avoid unnecessarily obscuring the present invention. Thus, the specific details set forth are merely exemplary. Particular implementations may vary from these exemplary details and still be contemplated to be within the spirit and scope of the present invention.

Reference in the description to "one embodiment" or "an embodiment" means that a particular feature, structure, or characteristic described in connection with the embodiment is included in at least one embodiment of the invention. The appearances of the phrase "in one embodiment" in various places in the specification do not necessarily all refer to the same embodiment. It is to be understood that the various embodiments of the invention, although different, are not necessarily mutually exclusive. Furthermore, the terms "above," "under," and "between" and "on" as used herein refer to a relative position of one component with respect to other components. As such, for example, one component above or under another component may be directly in contact with the other component or may have one or more intervening components.

Embodiments of the present invention disclose an integrated circuit package with a flex cable receptacle electrically attached to the top side of the package substrate. The flex cable receptacle connects to a flex cable through a zero or low insertion force connector without requiring a complex compressive loading mechanism to forcibly push a flex cable against the package substrate in order for the flex cable to make electrical contact with input/output (I/O) pads on the package substrate. As a result, the overall height of the integrated circuit package assembly can be reduced to enable low-profile and thin-formed system designs. Furthermore, by using a flex cable connection mechanism that is independent of the compressive loading mechanism that is used for the integrated circuit device socket, the location of the flex cable connection on the package substrate can be located outside of the area on the package substrate that corresponds to the footprint of the compressive loading mechanism. This allows the height of a heat sink pedestal that is used to compensate for the height of the compressive loading mechanism to be reduced to improve thermal dissipation, and also allows access to the flex cable without requiring removal of the heat sink.

FIG. 1 illustrates an exemplary stack up of an integrated circuit package assembly 100 that uses a flex cable 167 to interconnect input/output (I/O) signals of an integrated circuit device from the top side of the package substrate 102 according to one embodiment. The integrated circuit package includes a die 106 mounted on a package substrate 102, and an integrated heat spreader (IHS) 108 disposed above and covering the die 106. An integrated circuit device socket 105 is mounted on a motherboard 101, and a compressive loading mechanism 180 is mounted above the integrated circuit device socket 105 on the motherboard 101. The motherboard 101 also has a back plate 103 mounted to the back side of the motherboard 101 to provide support for the motherboard 101. After an integrated circuit package is placed in the integrated circuit device socket 105, a flex cable connector 151 electrically connected to a flex cable 167 is placed on top of the package substrate 102. The flex cable connector 151 is aligned with I/O pads formed on the package substrate 102 with guide pins. To balance the load applied to the integrated circuit device socket 105 and the motherboard 101 by the compressive loading mechanism 180, a load balancing dummy 107 is place on the package substrate 102 on an opposing side of the flex cable connector 151.

The compressive loading mechanism 180 has a retention frame 182 positioned around the perimeter of the integrated circuit device socket 105 and has a retention load plate 181 that is hinged to the retention frame 182. When locked in a closed position, the retention load plate 181 applies a downward force on the integrated circuit package to ensure the integrated circuit package makes proper electrical contact with the integrated circuit device socket 105. The retention load plate 181 also applies a downward force on the flex cable connector 151 to ensure the spring-loaded pins in the flex cable connector 151 is making proper electrical contact with I/O pads on the package substrate 102. After the retention load plate 181 is locked into place to secure the integrated circuit package to the integrated circuit device socket 105 and the flex cable connector 151 to the package substrate 102, a heat sink 190 is disposed above and covers the integrated circuit package. The heat sink 190 also covers the flex cable connector 151.

For each spring-loaded pin in the flex cable connector 151, 30 grams of force (gmf) is required to compressively force the spring-loaded pin against an I/O pad on the package substrate 102 for proper electrical contact. For example, a 300-pin flex cable connector 151 would require a load force of about 9000 gmf, which translates to about 20 pounds of force (lbf), for proper electrical contact between the spring-loaded pins and the I/O pads on the package substrate 102. Furthermore, the flex cable connector 151 can also be subjected to an additional 20 lbf of force or more resulting from the load bleed that occurs when the retention load plate 181 is engaged with the integrated circuit device socket 105. Thus, for a 300-pin flex cable connector 151, the retention load plate 181 of the compressive loading mechanism 180 may push down on the flex cable connector 151 with a total load that may exceed 40 lbf.

FIG. 2 illustrates a cross-sectional view of a section of the exemplary stack up of the integrated circuit package assembly 100 of FIG. 1 according to one embodiment. The cross-sectional view is taken along the dotted line A-B as shown in FIG. 1. Because of the large amount of load force that the compressive loading mechanism 180 pushes down on the flex cable connector 151 to engage the spring-loaded pins in the flex cable connector 151 with the I/O pads on the package substrate 102, a thick flex cable stiffener 153 is disposed above the flex cable 167 in order to adequately protect the flex cable 167. For example, the thickness of the flex cable stiffener 153 used to protect the flex cable 167 from the load of the compressive loading mechanism 180 may be about 3 millimeters (mm).

The height of the flex cable connector 151 may be about 1.5 mm, and the thickness of the flex cable 167 may be about 0.135 mm. Including the thickness of the retention load plate 181 that is above the flex cable connector 151, which may be about 1.5 mm, the total height of the flex cable connector assembly above the package substrate 102 may be about 6.135 mm. In contrast, the die 106 and the IHS 108 together may have a combined height of only about 3 mm above the package substrate 102. Accordingly, a heat sink pedestal 191 is disposed between the IHS 108 and the heat sink 190 to compensate for the height difference between the flex cable connector assembly and the combined height of the die 106 and IHS 108. A small air gap of about 1 mm is also provided above the retention load plate 181 such that the retention load plate 181 does not make direct contact with the heat sink 190. Taking all this into account, the heat sink pedestal 191 may have a height of about 4.125 mm, which is extra height that is added to the overall integrated circuit package assembly.

Requiring a tall heat sink pedestal 191 to be interposed between the heat sink 190 and the IHS 108 may also degrade the thermal dissipation performance of the integrated circuit package assembly. The thermal dissipation performance may be degraded because of the longer distance the generated heat has to travel before being dissipated through the heat sink. Furthermore, because the flex cable connector 151 and the integrated circuit device socket 105 use the same compressive loading mechanism 180, the location of the flex cable connection on the package substrate 102 is limited to the area on the package substrate 102 that corresponds to the footprint of the retention load plate 181 of the compressive loading mechanism 180. In addition, once the integrated circuit package assembly has been assembled, removal of the heat sink 190 is required before the flex cable connector 151 can be accessed, which makes replacing the flex cable 167 difficult.

FIG. 3 illustrates a cross sectional view of an integrated circuit package 300 with a flex cable receptacle 320 according to another embodiment of the present invention. The integrated circuit package 300 has a plurality of contact pads 304 formed on the top side of a package substrate 302. A die 306 is electrically attached and mounted to the plurality of contact pads 304. An IHS 308 is disposed above the die 306. A plurality of solder balls 305 is formed on the bottom side of the package substrate 302 to electrically couple the integrated circuit package 300 to an integrated circuit device socket or to a PCB motherboard.

A plurality of input/output (I/O) pads 312 are formed on a top side of the package substrate 302. The I/O pads 312 are electrically connected to the contact pads 304 through the package substrate 302 with interconnects 388. The interconnects 388 allow high speed signals to be routed from the die 306 to the I/O pads 312 for connecting to a flex cable without requiring the high speed signals to traverse out of the package substrate 302. This avoids socket and motherboard parasitics and reduces signal degradation to allow for faster signaling rates when connecting two integrated circuit devices through a flex cable. A flex cable receptacle 320 is electrically attached to the I/O pads 312 on the top side of the package substrate 302. By providing connections to a flex cable on the top side of the package substrate 302 and routing interconnect signals through the flex cable, faster signaling rates can be achieved because this signaling path bypasses the integrated circuit device socket and the motherboard. For example, for a 10 GHz signal, the transmission loss through a 20 inch interconnect path can be reduced from 25 dB for a printed circuit board down to 16 dB for a flex cable.

In one embodiment, the flex cable receptacle 320 is surface mounted to the I/O pads 312 through solder balls 314, and includes a plurality of receptacle connection pins 324 electrically connected to the plurality of I/O pads 312. The receptacle connection pins 324 are made of brass, nickel, or other metal or metallic alloys. The receptacle connection pins 324 are gold plated to provide better electrical conductivity. Because a flex cable receptacle 320 is surface mounted to the I/O pads 312, the I/O pads 312, according to embodiments of the present invention, can be sized smaller and with a tighter pitch than pads that are used for coupling to the spring-loaded pins of a flex cable connector that uses a compressive loading mechanism. By reducing the size of the I/O pads 312 and reducing the pitch of the I/O pads 312, more space can be made available for routing of signal traces in the package substrate 302. For example, in an exemplary embodiment, the pitch of the I/O pads 312 may be about 0.85 mm or less.

In the embodiment as shown in FIG. 3, the flex cable receptacle 320 that is attached to the package substrate 302 is a pin carrier 322. Generally, pin carrier 322 has pins that protrude out from a core 321, and may include a pin shroud to protect those pins. In one embodiment, the pin carrier has a core 321 that is made of a liquid crystal polymer (LCP) dielectric material. To form the pin carrier 322 according to this embodiment, the receptacle connection pins 324 are molded in place using the LCP as the dielectric material. In an alternative embodiment, the pin carrier 322 has a core 321 that is made of a printed circuit board material such as Flame Retardant Type-4 glass reinforced epoxy resin (FR4). To form the pin carrier 322 in this alternative embodiment, the receptacle connection pins 324 are press-fitted into holes drilled into the core 321 and are wave-soldered to retain the receptacle connection pins 324 in the core 321. It should be noted that the core 321 is used as a carrier to hold the receptacle connection pins 324 in place and that the interconnect signals are not routed in the core 321 material. Instead, the receptacle connection pins 324 provide the signaling paths for the interconnect signals. In an alternative embodiment, interconnect signals can be routed within the core 321 if additional routing space is needed.

Still referring to FIG. 3, in an embodiment, a flex cable assembly 360 includes a flex cable 367, a flex cable connector 350 electrically coupled to the flex cable 367, and a flex cable stiffener 364. The flex cable 367 has a connection portion 365 formed on both ends of the flex cable 367 (only one end is shown) and a transmission portion 366 formed between the two ends of the flex cable 367. At least the connection portion 365 on one of the two ends of the flex cable 367 is configured to mate with the flex cable receptacle 320. The connection portion 365 of the flex cable 367 includes a plurality of cable contacts 368. In an exemplary embodiment, the flex cable connector 350 is surface mounted to the cable contacts 368 with solder balls 362 on the bottom side of the connection portion 365 of the flex cable 367. The flex cable connector 350 includes a plurality of connector connection pins 354 electrically connected to the plurality of cable contacts 368. The connector connection pins 354 can be made of brass, nickel, or other metal or metallic alloys, and are gold plated to provide better electrical conductivity. A thin flex cable stiffener 364 is disposed on a top side of the connector portion 365 of the flex cable 367. The flex cable stiffener 364 may be made of FR4 or polyimide material. As explained below, because only a minimum amount of load is applied to the flex cable 367, the flex cable stiffener 364 according to embodiments of the present invention can be made much thinner than the ones used with a compressive loading mechanism.

According to embodiments of the present invention, the flex cable receptacle 320 is non-compressively attachable to the flex cable connector 350 of the flex cable assembly 360. The term "non-compressive" and its derivatives mean that only a minimum amount of force is required to engage the flex cable connector 350 with the flex cable receptacle 320, and that once the flex cable connector 350 is engaged with and attached to the flex cable receptacle 320, no additional load is required to maintain proper electrical connection between the flex cable connector 350 and flex cable receptacle 320. In an embodiment, a force of 5 gmf or less per pin is required to non-compressively attach the flex cable connector 350 to the flex cable receptacle 320. This is in contrast to the 30 gmf or more per pin that is required for a compressive loading mechanism that uses spring-loaded pins.

In the embodiment shown in FIG. 3, the flex cable receptacle 320 is a pin carrier 322 as described above, and the flex cable connector 350 is a flex cable socket 352. Generally, a flex cable socket 352 has pins that are embedded in the flex cable socket 352. To non-compressively attach the flex cable socket 352 to the pin carrier 322, the flex cable socket 352 is placed over the pin carrier 322, and the connector connection pins 354 are aligned with the receptacle connection pins 324. In an exemplary embodiment, notches or guide pins on the flex cable socket 352 and the pin carrier 322 can be used to assist with the alignment.

In an embodiment, the flex cable socket 352 is a zero insertion force (ZIF) socket with a cam box 356. After the connector connection pins 354 are aligned with the receptacle connection pins 324, the cam box 356 is rotated to engage the ZIF socket with the pin carrier 322. In the embodiment as shown, the cam box access is located on the surface mount side of the flex cable socket 352. In other words, the cam box access on the flex cable socket 352 is located on the same side as the solder balls 362. In an alternative embodiment, the cam box access on the flex cable socket 352 can be located on the opposite side of the solder balls 362 used to connect the flex cable socket 352 to the flex cable 367. The cam box 356 has a rotational member that can be rotated with a screwdriver or other keyed tool. As the rotational member is rotated, the rotational force is translated into lateral force to push the zero insertion force socket against the pin carrier 322. With a ZIF socket, because a cam box is used to translate rotational force into lateral force, only a minimum amount of force (close to zero) is required to non-compressively attach the flex cable socket 352 to the pin carrier 322.

In another embodiment, the flex cable socket 352 is a low insertion force (LIF) socket. A LIF socket does not have a cam box. Because a LIF socket does not have a cam box, in order to engage the flex cable socket 352 with the pin carrier 322, the flex cable socket 352 is press-fitted into the pin carrier 322 after aligning the connector connection pins 354 with the receptacle connection pins 324. For a LIF socket, less than 5 gmf per pin is applied to press-fit the flex cable socket 352 into the pin carrier 322.

Figure 5:
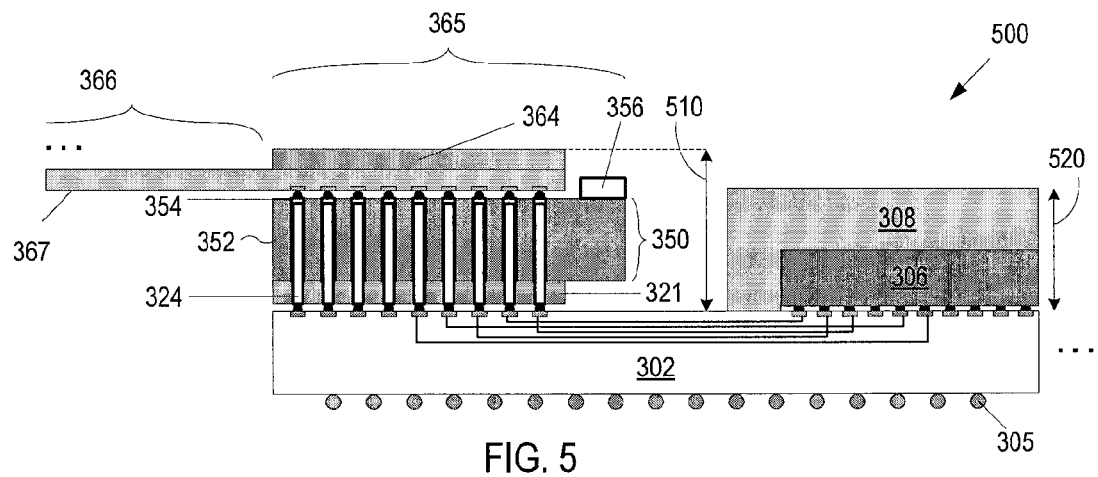
FIG. 5 illustrates a cross sectional view of an integrated circuit package attached to a flex cable assembly according to an embodiment of the present invention.
Figure 6:
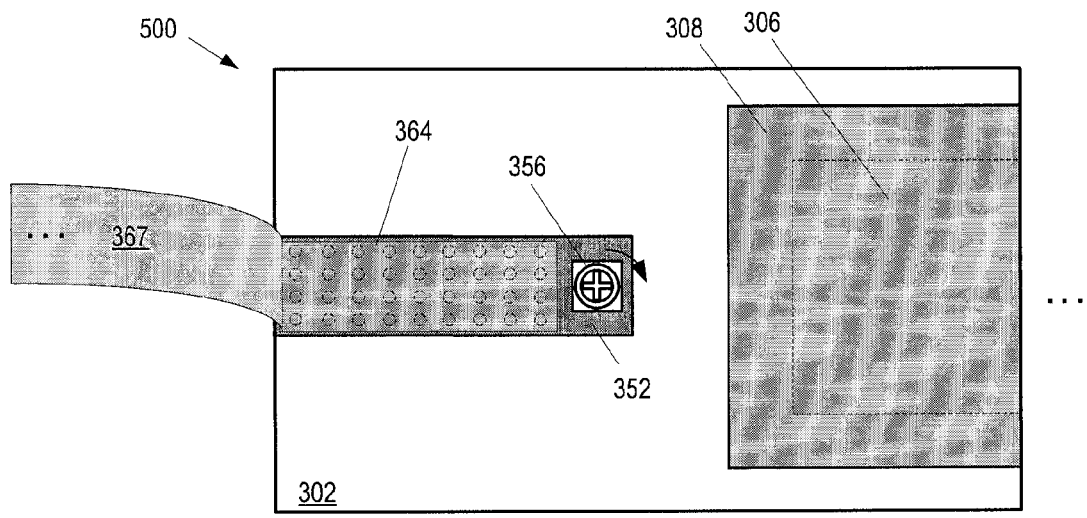
FIG. 6 illustrates a top view of an integrated circuit package attached to a flex cable assembly according to an embodiment of the present invention.

FIG. 5 illustrates a cross sectional view of an integrated circuit package assembly 500 when the flex cable connector 350 of FIG. 3 is fully engaged with the pin receptacle 320 of FIG. 3. FIG. 6 illustrates a top view of the integrated circuit package assembly 500. In the embodiment as shown, the connector connection pins 354 are female pins, the receptacle connection pins 324 are male pins. As the rotational member of the cam box 356 is rotated, the receptacle connection pins 324 (i.e. the male pins) are engaged with and inserted into the connector connection pins 354 (i.e. the female pins). The diameter of the male pins may be about 0.254 mm, and the diameter of the opening of the female pins is just slightly over 0.254 mm to accommodate the male pins such that when the male pins are engaged with the female pins, the male pins are in contact with the interior sidewalls of the female pins to provide a proper electrical connection as shown. In an alternative embodiment, the connector connection pins 354 can be the male pins, and the receptacle connection pins 324 can be the female pins. For a LIF socket embodiment, the male pins are engaged with the female pins in a similar manner when the flex cable connector 350 is press-fitted into the pin receptacle 320.

In both the zero and low insertion force socket embodiments, only a minimal amount of force (5 gmf per pin or less) is applied to the flex cable 367 when connecting the flex cable assembly 360 to the integrated circuit package 300. Consequently, the thickness of the flex cable stiffener 364 can be reduced. In an exemplary embodiment, the flex cable stiffener 364 may have a thickness of about 0.2 millimeter (mm) The flex cable 367 may have a thickness of 0.135 mm. The flex cable socket 352 including solder balls 362 may have a combined height of about 2 mm. The height of the connector connection pins 354 may be about 1.7 mm to 1.9 mm, and the connector connection pins 354 may be flush or recessed with bottom side of the flex cable socket 352 such that the connector connection pins 354 do not protrude out from the flex cable socket 352. Hence, in an exemplary embodiment, the total height of the flex cable assembly 360 may be about 2.335 mm.

In an embodiment, the pin carrier 322 that is mounted to the package substrate 302 may have a core 321 thickness in a range of 0.2 mm to 0.4 mm. Solder balls 314 may add a height of about 0.2 mm. When the flex cable socket 352 is fully engaged with the pin carrier 322, the top surface of the core 321 of the pin carrier 322 is flush with the bottom of the flex cable socket 352 as shown. Hence, solder balls 314 and the core 321 of the pin carrier 322 may add up to an extra 0.6 mm of height to the 2.335 mm height of the flex cable assembly 360, bringing the total height 510 of the flex cable connection to about 2.935 mm above the package substrate 304.

In one embodiment, the receptacle connection pins 324 may a height of about 1.7 mm to 1.9 mm above the core 321 such that when the flex cable socket 352 is fully engaged with the pin carrier 322, the male pins are fully inserted into the female pins. In other embodiments, the receptacle connection pins 324 may have a lower height such that when the flex cable socket 352 is fully engaged with the pin carrier 322, the male pins are partially inserted into the female pins. In further embodiments, the flex cable socket 352 can be designed to accommodate the core 321 such that when the flex cable socket 352 is fully engaged with the pin carrier 322, the bottom side (solder ball side) of the core 321 is flush with the bottom of the flex cable socket 352. In other words, in further embodiments, the entire pin carrier 322 including the core 321 can be inserted into the flex cable socket 352.

In one embodiment, the combined height 520 of the die 306 and IHS 308 including any interposed thermal interface material may be about 2.655 mm. By reducing the height 510 of the flex cable connection (about 2.935 mm in one embodiment) to be close to the combined height 520 of the die 306 and IHS 308 (about 2.655 mm in one embodiment), the height of the heat sink pedestal in the resulting integrated circuit package assembly can be reduced to improve thermal dissipation. In an exemplary embodiment, the heart sink pedestal height is reduced to less than 1 mm. In another embodiment, the heat sink pedestal may be eliminated all together such that an assembled integrated circuit package assembly is without an interposed heat sink pedestal between the IHS and the heat sink.

Figure 4:
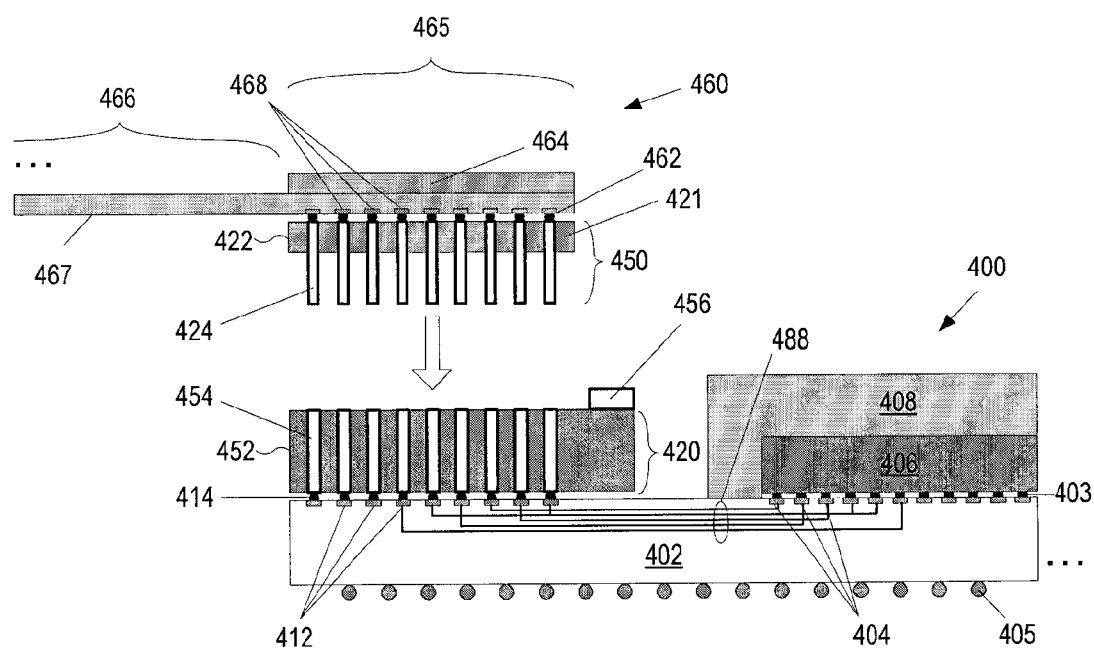
FIG. 4 illustrates a cross sectional view of an integrated circuit package and a flex cable assembly according to a different embodiment of the present invention.

FIG. 4 illustrates an integrated circuit package 400 with a flex cable receptacle 420 according to an alternative embodiment of the present invention. Instead of being a pin carrier, the flex cable receptacle 420 that is mounted to the package substrate 402 is a flex cable socket 452 with receptacle connection pins 454. In one embodiment, the flex cable socket 452 is a zero insertion force socket with a cam box 456. In another embodiment, the flex cable socket 452 is a low insertion force socket. The flex cable socket 452 is non-compressively attachable to a flex cable connector 450 that is part of the flex cable assembly 460. The flex cable connector 450 according to this embodiment is a pin carrier 422 with a core 421 and connector connection pins 424. With the exception that it is a flex cable socket that is mounted to the package substrate 402, and that it is a pin carrier that is mounted to the flex cable 467, the materials, dimensions, and operations of the components of the integrated circuit package 400 are similar to those described with reference to FIG. 3 above and hence need not be repeated here.

More generally, according to embodiments of the present invention, the flex cable receptacle that is attached to the package substrate can be a pin carrier or a flex cable socket, which can be a ZIF or a LIF socket. If the flex cable receptacle is a pin carrier, then the flex cable connector that is part of the flex cable assembly would be a flex cable socket, and vice versa. Furthermore, each one of the receptacle connection pins or the connector connection pins can be a male pin or a female pin. If a particular receptacle connection pin is a male pin, then the corresponding connector connection pin is a female pin, and vice versa. One advantage of using a pin carrier as the flex cable receptacle that is attached to the package substrate (as opposed to using a flex cable socket) is that it may be possible to design a pin carrier that can accommodate either a ZIF or a LIF socket, such that switching between a ZIF or a LIF socket implementation can be as simple as switching out the flex cable assembly.

Figure 7:
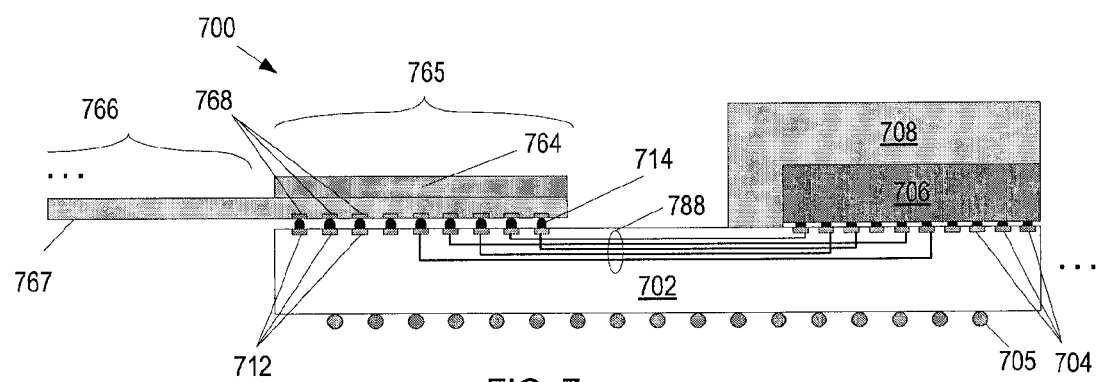
FIG. 7 illustrates a cross sectional view of an integrated circuit package attached to a flex cable assembly according to another embodiment of the present invention.

While the embodiments described above uses a flex cable receptacle to connect the package substrate to a flex cable through a flex cable connector, in an alternative embodiment where it may be viable to have the flex cable be permanently attached to the package substrate after package assembly, a flex cable can be directly affixed onto the package substrate as shown in FIG. 7. FIG. 7 illustrates a cross sectional view of an integrated circuit package assembly 700 with a flex cable 767 soldered onto the package substrate 702. The die 706 is electrically coupled to a plurality of contact pads 704 formed on the top side of the package substrate 702, and the contact pads 704 are electrically coupled to the I/O pads 712 through interconnects 788 in the package substrate 702. In this embodiment, the flex cable 767 has a plurality of cable contacts 768 that are directly soldered onto the plurality of I/O pads 712 on the top side of the package substrate 702 through solder balls 714 to electrically couple the flex cable 767 to the die 706. In such an embodiment, the signal quality of the interconnections can be further improved by eliminating the flex cable receptacle and the flex cable connector. Moreover, the height of the flex cable connection can be made lower than the combined height of the die 706 and IHS 708 such that a heat sink can be disposed above the IHS 708 without an interposed heat sink pedestal. However, in such an embodiment, subsequent removal of the flex cable 767 does require that the flex cable 767 be de-soldered from the package substrate 702.

Figure 8A:
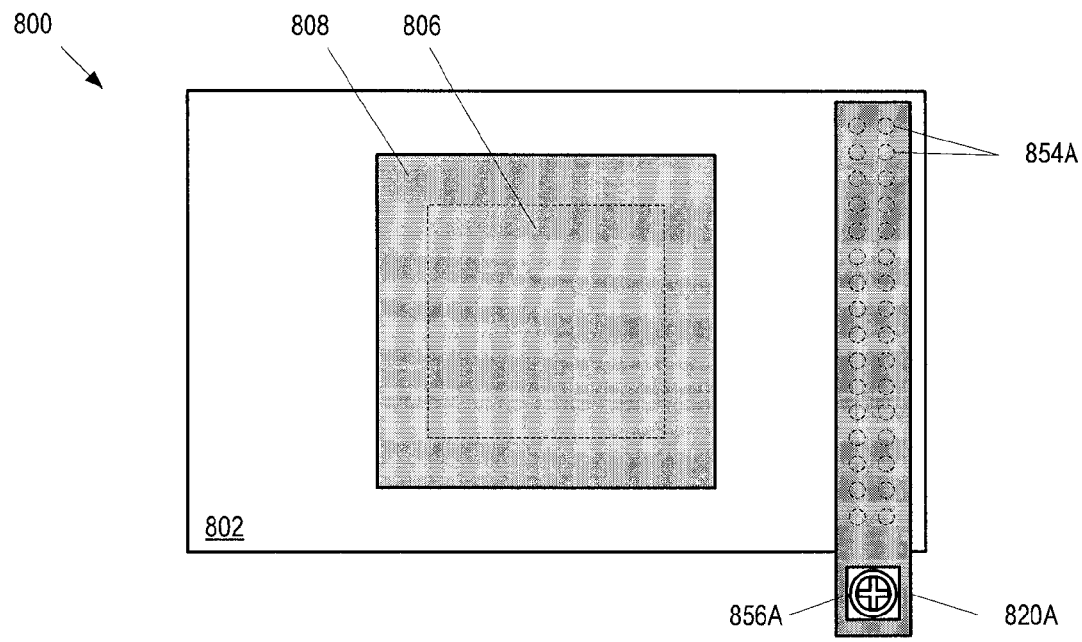
FIG. 8A illustrates a top view of an integrated circuit package according to one embodiment of the present invention.

FIG. 8A illustrates a top view of an integrated circuit package 800 according to one embodiment of the present invention. The integrated circuit package 800 has a package substrate 802 and a die 806 mounted onto the package substrate 802. An IHS 808 is disposed above and covers the die 806. A heat sink (not shown) is disposed above the IHS 808, covering the area on the top surface of the IHS 808. The integrated circuit package 800 also includes a flex cable receptacle 820A that is mounted to the package substrate 802. The flex cable receptacle 820A has a plurality of receptacle connection pins 854A and is non-compressively attachable to a flex cable connector. In one embodiment as shown, the flex cable receptacle 820A is a zero insertion force socket with a cam box 856A. In another embodiment, the flex cable receptacle 820A may be a low insertion force socket or may be a pin carrier. In an exemplary embodiment, the flex cable receptacle 820A may have 350 receptacle connection pins 854A. As illustrated, by using a flex cable connection mechanism that is independent of the compressive loading mechanism used for the integrated circuit device socket, the location of the flex cable connection on the package substrate 802 can be located away from the area on the package substrate 802 that corresponds to the footprint of the compressive loading mechanism. This allows the location of the flex cable connection to be placed away from the heat sink and allows access to the flex cable receptacle 820 without requiring removal of the heat sink.

Figure 8B:
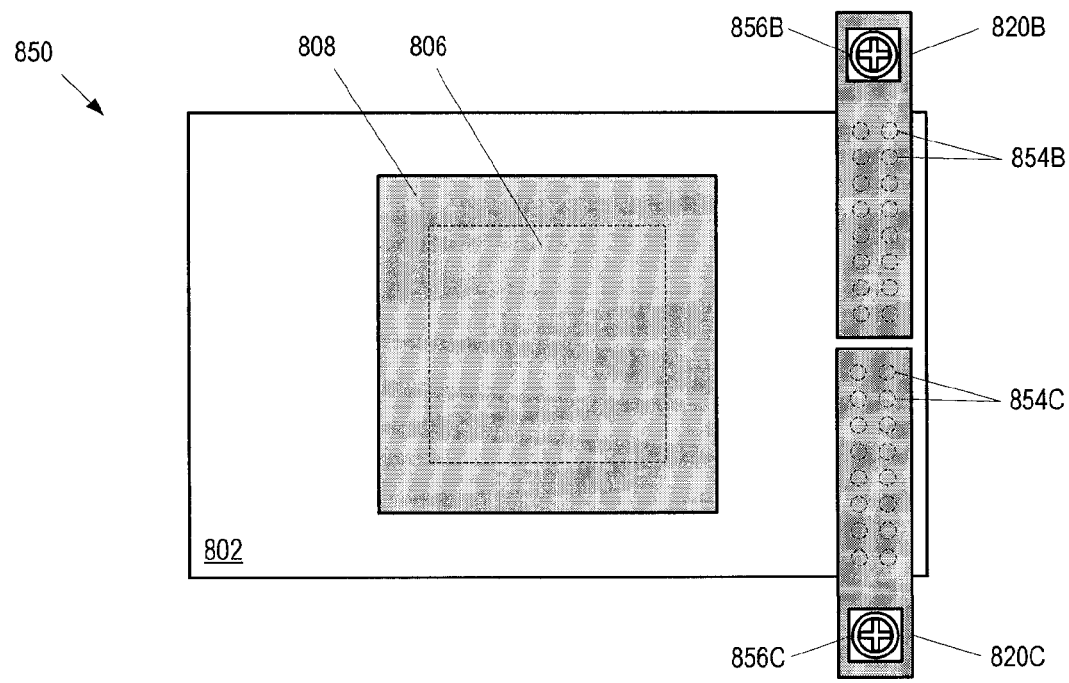
FIG. 8B illustrates a top view of an integrated circuit package according to a different embodiment of the present invention.

FIG. 8B illustrates a top view of an integrated circuit package 850 according to another embodiment of the present invention. Using a flex cable connection mechanism that is independent of the compressive loading mechanism used for the integrated circuit device socket also enables the possibilities of having one or more flex cable receptacles mounted on the package substrate 802, and allows different sizes and configurations of the flex cable receptacles. For example, as shown in FIG. 8, the integrated circuit package 850 may have two flex cable receptacles 820B and 820C. In an exemplary embodiment, each of the flex cable receptacles 820B and 820C has 175 receptacle connection pins 854B and 854C, respectively, for a total of 350 receptacle connection pins. In other embodiments, additional flex cable receptacles can be placed on the different sides of the die 806. By using a flex cable connection mechanism that is independent of the compressive loading mechanism used for the integrated circuit device socket, the placements of the flex cable receptacles are not restricted to the footprint of the compressive loading mechanism. As such, depending on the requirements or feasibility of a particular application or design, one or more flex cable receptacles can have any number of pins and rows as necessary, and can be placed in any number of different locations on the package substrate, for example, as shown in FIG. 6, 8A, or 8B. Furthermore, for ZIF socket implementations, the flex cable receptacle can be placed such that the cam box can be positioned above the package substrate (e.g., FIG. 6) or the cam box can be positioned outside the footprint of the package substrate (e.g., FIGS. 8A and 8B).

Figure 9:
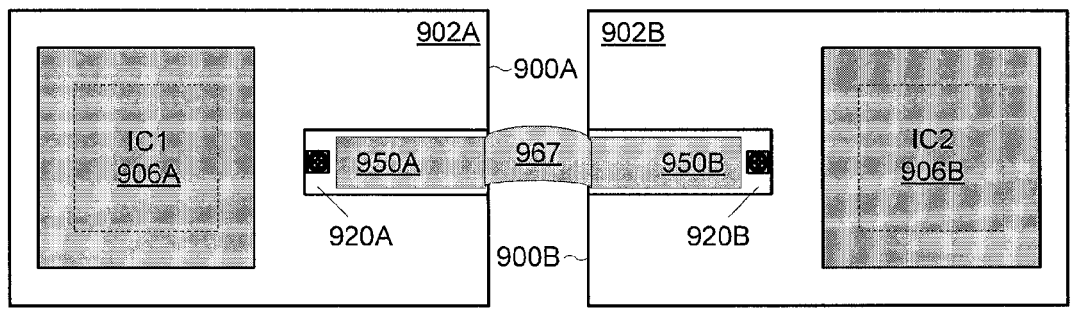
FIG. 9 illustrates a top view of a flex cable connection between two integrated circuit packages according to one embodiment of the present invention.

FIG. 9 illustrates a top view of a flex cable connection between two integrated circuit packages 900A and 900B according to one embodiment of the present invention. The integrate circuit package 900A includes a die 906A disposed on package substrate 902A and a flex cable receptacle 920A. The integrate circuit package 900B includes a die 906B disposed on package substrate 902B and a flex cable receptacle 920B. A flex cable 967 is attached to the flex cable receptacles 920A and 920B with flex cable connectors 950A and 950B, respectively. The die 906A may be a microprocessor die. The die 906B may be another microprocessor die, a memory die, a graphics die, a communications die, or any other integrated circuit die that requires high speed interconnectivity to the microprocessor die 906A.

In one particular embodiment, die 906A is a microprocessor die, and die 906B is a microprocessor dice, and the flex cable 967 is used for a microprocessor-to-microprocessor connection. By having respective flex cable receptacles 920A and 920B on the top side of the respective package substrates 902A and 902B, direct communication between the microprocessors is enabled without the need for the interconnect signals to traverse through sockets and PCB. Furthermore, the orientation and location of the flex cable receptacles 920A and 920B on package substrates 902A and 902B, respectively, are not restricted to the area under the footprint of the compressive loading mechanism. As shown in FIG. 9, the flex cable receptacles 920A and 920B can be orientated perpendicular to the nearest edge of the die 906A and die 906B, respectively, to allow more flexibility in system design. Such orientations would not be possible when using compressive loading techniques for the flex cable connection.

Figure 10:
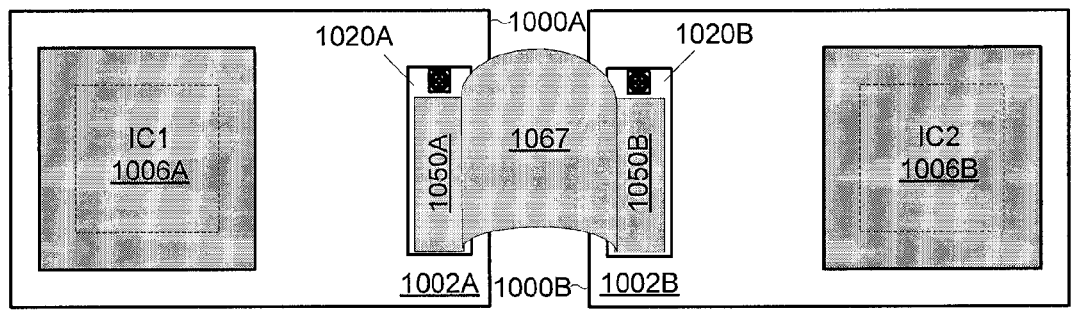
FIG. 10 illustrates a top view of a flex cable connection between two integrated circuit packages according to another embodiment of the present invention.

FIG. 10 illustrates a top view of a flex cable connection with a different orientation between two integrated circuit packages 1000A and 1000B according to another embodiment of the present invention. By using a flex cable connection mechanism that is independent of the compressive loading mechanism used for the integrated circuit device socket, the placements of the flex cable receptacles 1020A and 1020B can be placed in any number of different orientations, for example, as shown in FIG. 10. In FIG. 10, the flex cable receptacles 1020A and 1020B are placed near the edge of the package substrates 1002A and 1002B, respectively, to reduce the length of the flex cable 1067. Such placements would not be possible when using compressive loading techniques for the flex cable connection. As with FIG. 9 described above, the die 1006A may be a microprocessor die. The die 1006B may be another microprocessor die, a memory die, a graphics die, a communications die, or any other integrated circuit die that requires high speed interconnectivity to the microprocessor die 1006A.

Figure 11:
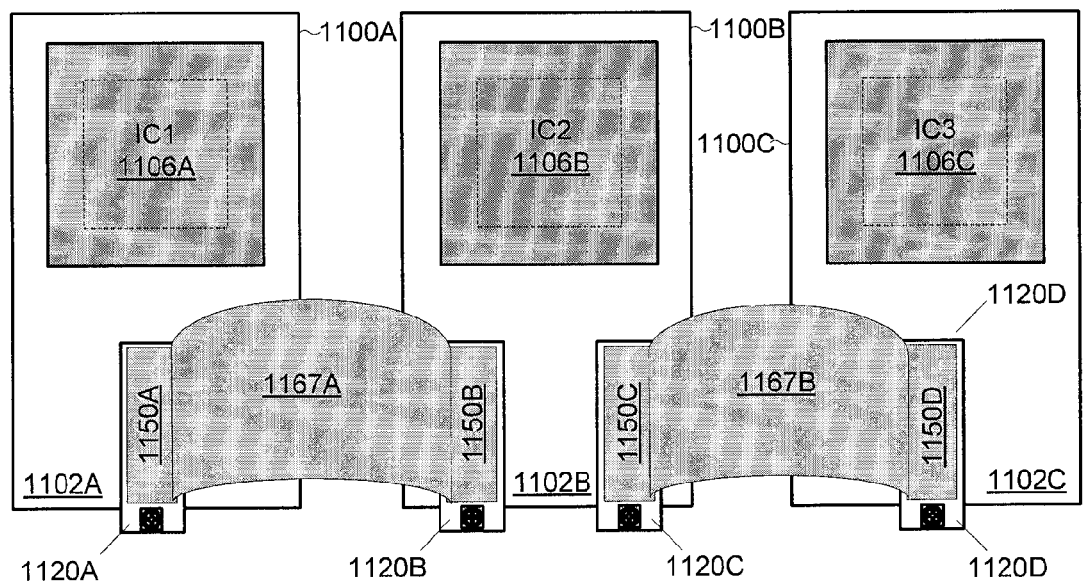
FIG. 11 illustrates a top view of flex cable connections between three integrated circuit packages according to one embodiment of the present invention.

FIG. 11 illustrates a top view of flex cable connections between three integrated circuit packages 1100A, 1100B, and 1100C according to a further embodiment of the present invention. As illustrated, embodiments of the present invention can be used to electrically couple two or more integrated circuit packages. In FIG. 11, the integrated circuit package 1100B has two flex cable receptacles 1150B and 1150C. This allows the integrated circuit package 1100B to be connected to two separate integrated circuit packages 1100A and 1100C, and also allows the integrated circuit package 1100B to act as a bridge between the integrated circuit packages 1100A and 1100C. Such a configuration may not be possible when using compressive loading techniques for the flex cable connections because the two flex cable receptacles 1150B and 1150C would have been required to be located under the footprint of a compressive loading mechanism. Any of the dice 1106A, 1106B, and 1106C can be a microprocessor die, a memory die, a graphics die, a communications die, or any other integrated circuit die that requires high speed interconnectivity. In a further embodiment, a flex cable according to embodiments of the present invention can also be used to connect an integrated circuit package to a PCB such as a motherboard.

Figure 12:
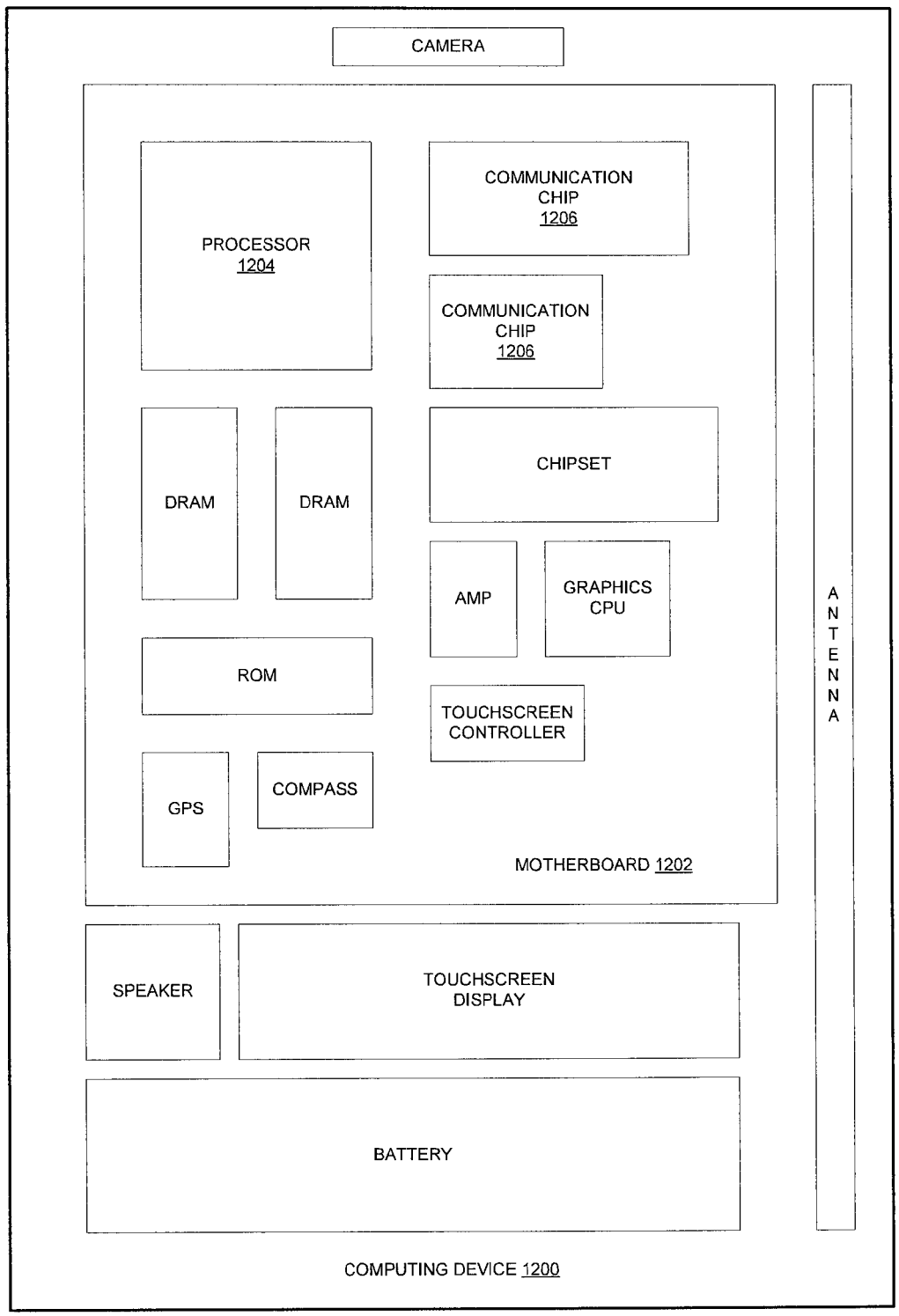
FIG. 12 illustrates a computing system according to one embodiment of the present invention.

FIG. 12 illustrates a computing device 1200 in accordance with one implementation of the invention. The computing device 1200 houses a board 1202. The board 1202 may include a number of components, including but not limited to a processor 1204 and at least one communication chip 1206. The processor 1204 is physically and electrically coupled to the board 1202. In some implementations the at least one communication chip 1206 is also physically and electrically coupled to the board 1202. In further implementations, the communication chip 1206 is part of the processor 1204.

Depending on its applications, computing device 1200 may include other components that may or may not be physically and electrically coupled to the board 1202. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1206 enables wireless communications for the transfer of data to and from the computing device 1200. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1206 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1200 may include a plurality of communication chips 1206. For instance, a first communication chip 1206 may be dedicated to shorter range wireless communications such as Wi-Fi and Bluetooth and a second communication chip 1206 may be dedicated to longer range wireless communications such as GPS, EDGE, GPRS, CDMA, WiMAX, LTE, Ev-DO, and others.

The processor 1204 of the computing device 1200 includes an integrated circuit die packaged within the processor 1204. In some implementations of the invention, the integrated circuit die of the processor 1204 is packaged in an integrated circuit package having a flex cable receptacle and is interconnected to another integrated circuit package or device with a flex cable in accordance with implementations of the present invention. The term "processor" may refer to any device or portion of a device that processes electronic data from registers and/or memory to transform that electronic data into other electronic data that may be stored in registers and/or memory.

The communication chip 1206 also includes an integrated circuit die packaged within the communication chip 1206. In accordance with another implementation of the invention, the integrated circuit die of the communication chip 1206 is packaged in an integrated circuit package having a flex cable receptacle and is interconnected to another integrated circuit package or device with a flex cable in accordance with implementations of the present invention. In a particular embodiment, the communication chip 1206 is interconnected with the processor 1204 through a flex cable to enable direct communication between the communication chip 1206 and the processor 1204 without going through a socket or board 1202.

In further implementations, another component housed within the computing device 1200 may contain an integrated circuit die that is packaged in an integrated circuit package and interconnected with another integrated circuit package or device with a flex cable in accordance with implementations of the present invention In various implementations, the computing device 1200 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1200 may be any other electronic device that processes data.

The foregoing description of the preferred embodiments is provided to enable any person skilled in the art to make or use the present invention. Various modifications to these embodiments are possible, and the generic principles presented herein may be applied to other embodiments as well. As such, the present invention is not intended to be limited to the embodiments shown above but rather is to be accorded the widest scope consistent with the principles and novel features disclosed in any fashion herein.

What is claimed is:

1. A flex cable assembly, comprising:
   a flex cable comprising:
      a connector portion formed on at least one of two ends of the flex cable, wherein the connector portion includes a plurality of cable contacts; and
      a transmission portion formed between the two ends of the flex cable, wherein the transmission portion comprises a plurality of traces electrically coupled to the plurality of cable contacts
   a flex cable stiffener disposed on a top side of the connector portion of the flex cable; and
   a flex cable connector attached to a bottom side of the connector portion of the flex cable, wherein the flex cable connector includes a plurality of connector connection pins electrically coupled to the plurality of cable contacts, and the flex cable connector is attachable to a flex cable receptacle that is mounted on a package substrate of an integrated circuit package.

2. The flex cable assembly of claim 1, wherein the flex cable connector is a pin carrier.

3. The flex cable assembly of claim 2, wherein the flex cable receptacle is one of a low-insertion force socket or a zero-insertion force socket with a cam box.

4. The flex cable assembly of claim 2, wherein the pin carrier further comprises a pin shroud.

5. The flex cable assembly of claim 2, wherein the pin carrier has a core made of a material selected from a group consisting of a liquid crystal polymer dielectric and a printed circuit board material.

6. The flex cable assembly of claim 1, wherein the flex cable connector is one of a low-insertion force socket or a zero-insertion force socket with a cam box.

* * * * *